(12) United States Patent
Curtis et al.

(10) Patent No.: US 9,105,797 B2
(45) Date of Patent: Aug. 11, 2015

(54) LIQUID PRECURSOR INKS FOR DEPOSITION OF IN—SE, GA—SE AND IN—GA—SE

(75) Inventors: Calvin J. Curtis, Lakewood, CO (US); Peter A. Hersh, Denver, CO (US); Alexander Miedaner, Boulder, CO (US); Susan Habas, Boulder, CO (US); Maikel van Hest, Lakewood, CO (US); David S. Ginley, Evergreen, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 300 days.

(21) Appl. No.: 13/602,454

(22) Filed: Sep. 4, 2012

(65) Prior Publication Data

US 2013/0323878 A1     Dec. 5, 2013

Related U.S. Application Data

(60) Provisional application No. 61/689,182, filed on May 31, 2012.

(51) Int. Cl.
| | |
|---|---|
| H01B 1/12 | (2006.01) |
| H01L 21/00 | (2006.01) |
| H01L 31/18 | (2006.01) |
| H01L 31/0216 | (2014.01) |
| H01L 31/032 | (2006.01) |
| H01L 31/0392 | (2006.01) |

(52) U.S. Cl.
CPC .......... *H01L 31/18* (2013.01); *H01L 31/02167* (2013.01); *H01L 31/0322* (2013.01); *H01L 31/03923* (2013.01); *Y02E 10/541* (2013.01)

(58) Field of Classification Search
None
See application file for complete search history.

(56) References Cited

U.S. PATENT DOCUMENTS

| | | | |
|---|---|---|---|
| 2,838,149 A | 6/1958 | Burton |
| 2,846,343 A | 8/1958 | Mason |
| 3,014,779 A | 12/1961 | Conn et al. |
| 3,629,036 A | 12/1971 | Isaacson |
| 4,088,544 A | 5/1978 | Hutkin |
| 4,267,398 A | 5/1981 | Rothwarf |
| 4,315,097 A | 2/1982 | Solomon |
| 4,322,571 A | 3/1982 | Stanbery |

(Continued)

FOREIGN PATENT DOCUMENTS

| | | |
|---|---|---|
| CA | 2712114 | 8/2009 |
| CN | 15472760 | 11/2004 |

(Continued)

OTHER PUBLICATIONS

Nurdan Demirci Sankir, Flexible Electronics: Materials and Device Fabrication, dissertation Virginia Polytechnic Institute, Dec. 7, 2005.

(Continued)

*Primary Examiner* — Harold Pyon
*Assistant Examiner* — Jaison Thomas
(74) *Attorney, Agent, or Firm* — John C. Stolpa; Suzanne C. Walts; Michael A. McIntyre

(57) ABSTRACT

An ink includes a solution of selenium in ethylene diamine solvent and a solution of at least one metal salt selected from the group consisting of an indium salt or a gallium salt in at least one solvent including an organic amide. The organic amide can include dimethylformamide. The organic amide can include N-methylpyrrolidone.

15 Claims, 1 Drawing Sheet

(56) References Cited

U.S. PATENT DOCUMENTS

| | | |
|---|---|---|
| 4,392,451 A | 7/1983 | Mickelsen et al. |
| 4,479,847 A | 10/1984 | McCaldin et al. |
| 4,523,051 A | 6/1985 | Mickelsen et al. |
| RE31,968 E | 8/1985 | Mickelsen et al. |
| 4,571,448 A | 2/1986 | Barnett |
| 4,609,820 A | 9/1986 | Miyamoto |
| 4,611,091 A | 9/1986 | Choudary et al. |
| 4,674,434 A | 6/1987 | Ishihara |
| 4,737,384 A | 4/1988 | Murthy et al. |
| 4,823,176 A | 4/1989 | Baliga et al. |
| 4,864,599 A | 9/1989 | Saegusa et al. |
| 4,902,395 A | 2/1990 | Yoshimura |
| 4,902,398 A | 2/1990 | Homstad |
| 4,902,668 A | 2/1990 | Whitcomb et al. |
| 5,028,274 A | 7/1991 | Basol et al. |
| 5,055,150 A | 10/1991 | Rosenfeld et al. |
| 5,124,308 A | 6/1992 | Albin et al. |
| 5,132,248 A | 7/1992 | Drummond et al. |
| 5,178,967 A | 1/1993 | Rosenfeld et al. |
| 5,248,621 A | 9/1993 | Sano |
| 5,298,449 A | 3/1994 | Kikuchi |
| 5,396,839 A | 3/1995 | Rice |
| 5,405,802 A | 4/1995 | Yamagata et al. |
| 5,436,204 A | 7/1995 | Albin et al. |
| 5,441,897 A | 8/1995 | Noufi et al. |
| 5,477,088 A | 12/1995 | Rockett et al. |
| 5,477,288 A | 12/1995 | Miyazaki et al. |
| 5,567,469 A | 10/1996 | Wada et al. |
| 5,578,503 A | 11/1996 | Karg et al. |
| 5,626,688 A | 5/1997 | Probst et al. |
| 5,628,817 A | 5/1997 | Fugleberg et al. |
| 5,674,555 A | 10/1997 | Birkmire et al. |
| 5,687,218 A | 11/1997 | Nakayama |
| 5,705,011 A | 1/1998 | Bodford et al. |
| 5,730,852 A | 3/1998 | Bhattacharya et al. |
| 5,731,031 A | 3/1998 | Bhattacharya et al. |
| 5,756,240 A | 5/1998 | Roberts et al. |
| 5,759,954 A | 6/1998 | Taguchi et al. |
| 5,794,163 A | 8/1998 | Paterson et al. |
| 5,846,638 A | 12/1998 | Meissner |
| 5,858,121 A | 1/1999 | Wada et al. |
| 5,858,628 A | 1/1999 | Yoshida et al. |
| 5,948,176 A | 9/1999 | Ramanathan et al. |
| 5,985,691 A | 11/1999 | Basol et al. |
| 6,021,207 A | 2/2000 | Puthuff et al. |
| 6,023,020 A | 2/2000 | Nishitani et al. |
| 6,026,082 A | 2/2000 | Astrin |
| 6,072,818 A | 6/2000 | Hayakawa |
| 6,100,165 A | 8/2000 | Sakaguchi et al. |
| 6,121,541 A | 9/2000 | Arya |
| 6,126,740 A | 10/2000 | Schulz et al. |
| 6,127,202 A | 10/2000 | Kapur et al. |
| 6,141,356 A | 10/2000 | Gorman |
| 6,146,979 A | 11/2000 | Henley et al. |
| 6,185,418 B1 | 2/2001 | MacLellan et al. |
| 6,187,653 B1 | 2/2001 | Hui et al. |
| 6,190,453 B1 | 2/2001 | Boydston et al. |
| 6,225,190 B1 | 5/2001 | Bruel et al. |
| 6,225,199 B1 | 5/2001 | Han et al. |
| 6,251,754 B1 | 6/2001 | Ohshima et al. |
| 6,313,479 B1 | 11/2001 | Zhang et al. |
| 6,323,417 B1 | 11/2001 | Gillespie et al. |
| 6,339,695 B1 | 1/2002 | Clark |
| 6,368,892 B1 | 4/2002 | Arya |
| 6,372,538 B1 | 4/2002 | Wendt et al. |
| 6,379,585 B1 | 4/2002 | Vecht et al. |
| 6,399,486 B1 | 6/2002 | Chen et al. |
| 6,455,398 B1 | 9/2002 | Fonstad, Jr. et al. |
| 6,475,354 B1 | 11/2002 | Toyama |
| 6,500,733 B1 | 12/2002 | Stanbery |
| 6,521,511 B1 | 2/2003 | Inoue et al. |
| 6,559,372 B2 | 5/2003 | Stanbery |
| 6,576,291 B2 | 6/2003 | Bawendi et al. |
| 6,593,213 B2 | 7/2003 | Stanbery |
| 6,599,378 B1 | 7/2003 | Hagiwara et al. |
| 6,669,830 B1 | 12/2003 | Inoue et al. |
| 6,720,239 B2 | 4/2004 | Stanbery |
| 6,736,986 B2 | 5/2004 | Stanbery |
| 6,787,012 B2 | 9/2004 | Stanbery |
| 6,797,874 B2 | 9/2004 | Stanbery |
| 6,821,337 B2 | 11/2004 | Bawendi et al. |
| 6,830,778 B2 | 12/2004 | Schulz et al. |
| 6,852,920 B2 | 2/2005 | Sager et al. |
| 6,855,202 B2 | 2/2005 | Alivisatos et al. |
| 6,881,647 B2 | 4/2005 | Stanbery |
| 6,936,761 B2 | 8/2005 | Pichler |
| 6,974,976 B2 | 12/2005 | Hollars |
| 6,979,370 B2 | 12/2005 | Vaartstra |
| 6,987,071 B1 | 1/2006 | Bollman et al. |
| 7,045,205 B1 | 5/2006 | Sager |
| 7,094,651 B2 | 8/2006 | Mitzi et al. |
| 7,097,902 B2 | 8/2006 | Blanton et al. |
| 7,306,823 B2 | 12/2007 | Sager et al. |
| 7,341,917 B2 | 3/2008 | Milliron et al. |
| 7,390,715 B2 | 6/2008 | Ou et al. |
| 7,422,696 B2 | 9/2008 | Mirkin et al. |
| 7,663,057 B2 | 2/2010 | Yu et al. |
| 7,691,294 B2 | 4/2010 | Chung et al. |
| 7,838,063 B2 | 11/2010 | Yoon |
| 7,867,413 B2 | 1/2011 | Lee et al. |
| 7,879,696 B2 | 2/2011 | Kunze et al. |
| 7,922,804 B2 | 4/2011 | Chuang |
| 8,021,641 B2 | 9/2011 | Curtis et al. |
| 8,048,477 B2 | 11/2011 | Van Duren et al. |
| 8,057,850 B2 | 11/2011 | Curtis et al. |
| 8,366,967 B2 | 2/2013 | Keszler et al. |
| 2002/0006470 A1 | 1/2002 | Eberspacher et al. |
| 2002/0016188 A1 | 2/2002 | Kashiwamura |
| 2002/0043279 A1 | 4/2002 | Karg |
| 2003/0051664 A1 | 3/2003 | Stanbery |
| 2003/0052391 A1 | 3/2003 | Stanbery |
| 2003/0054582 A1 | 3/2003 | Stanbery |
| 2003/0054662 A1 | 3/2003 | Stanbery |
| 2003/0054663 A1 | 3/2003 | Stanbery |
| 2003/0123167 A1 | 7/2003 | Kolberg et al. |
| 2003/0201010 A1 | 10/2003 | Koyanagi et al. |
| 2004/0063320 A1 | 4/2004 | Hollars |
| 2004/0131792 A1 | 7/2004 | Bhattacharya |
| 2004/0219730 A1 | 11/2004 | Basol |
| 2004/0250848 A1 | 12/2004 | Sager et al. |
| 2004/0261841 A1 | 12/2004 | Negami et al. |
| 2005/0000414 A1 | 1/2005 | Culik et al. |
| 2005/0009225 A1 | 1/2005 | Mitzi et al. |
| 2005/0028861 A1 | 2/2005 | Aoki et al. |
| 2005/0084689 A1 | 4/2005 | Hwang et al. |
| 2005/0095422 A1 | 5/2005 | Sager et al. |
| 2005/0098204 A1 | 5/2005 | Roscheisen et al. |
| 2005/0098205 A1 | 5/2005 | Roscheisen et al. |
| 2005/0109392 A1 | 5/2005 | Hollars |
| 2005/0121068 A1 | 6/2005 | Sager et al. |
| 2005/0158909 A1 | 7/2005 | Milliron et al. |
| 2005/0183767 A1 | 8/2005 | Yu et al. |
| 2005/0183768 A1 | 8/2005 | Roscheisen et al. |
| 2005/0186342 A1 | 8/2005 | Sager et al. |
| 2005/0218377 A1 | 10/2005 | Lawandy |
| 2006/0062902 A1 | 3/2006 | Sager et al. |
| 2006/0207644 A1 | 9/2006 | Robinson et al. |
| 2007/0077429 A1 | 4/2007 | Mirkin et al. |
| 2007/0093006 A1 | 4/2007 | Basol |
| 2007/0119522 A1 | 5/2007 | Grier et al. |
| 2007/0152236 A1 | 7/2007 | Halpert et al. |
| 2007/0163638 A1 | 7/2007 | Van Duren et al. |
| 2007/0163642 A1 | 7/2007 | Van Duren et al. |
| 2007/0163643 A1 | 7/2007 | Van Duren et al. |
| 2007/0163644 A1 | 7/2007 | Van Duren et al. |
| 2007/0166453 A1 | 7/2007 | Van Duren et al. |
| 2007/0169813 A1 | 7/2007 | Robinson et al. |
| 2007/0178620 A1 | 8/2007 | Basol |
| 2007/0234949 A1 | 10/2007 | Ahan et al. |
| 2007/0261951 A1 | 11/2007 | Ye et al. |
| 2007/0264504 A1 | 11/2007 | Mitzi et al. |
| 2008/0057616 A1 | 3/2008 | Robinson et al. |
| 2008/0121277 A1 | 5/2008 | Robinson et al. |
| 2008/0124831 A1 | 5/2008 | Robinson et al. |

(56) References Cited

U.S. PATENT DOCUMENTS

| | | | |
|---|---|---|---|
| 2008/0135099 A1 | 6/2008 | Yu et al. | |
| 2008/0142081 A1 | 6/2008 | Yu et al. | |
| 2008/0142082 A1 | 6/2008 | Ye et al. | |
| 2008/0149176 A1 | 6/2008 | Sager et al. | |
| 2008/0175982 A1 | 7/2008 | Robinson et al. | |
| 2008/0194103 A1 | 8/2008 | Wagner | |
| 2008/0242088 A1 | 10/2008 | Suzuki | |
| 2009/0004445 A1 | 1/2009 | Park et al. | |
| 2009/0214763 A1* | 8/2009 | Joo et al. | 427/76 |
| 2009/0226603 A1 | 9/2009 | Lowrey | |
| 2009/0260670 A1 | 10/2009 | Li | |
| 2009/0261951 A1 | 10/2009 | Chang et al. | |
| 2009/0280624 A1 | 11/2009 | Curtis et al. | |
| 2009/0305449 A1 | 12/2009 | Bollman et al. | |
| 2010/0096015 A1 | 4/2010 | Robinson et al. | |
| 2010/0319776 A1 | 12/2010 | Choe et al. | |
| 2011/0008244 A1 | 1/2011 | Brutchey et al. | |
| 2011/0014377 A1 | 1/2011 | Mosley | |
| 2011/0020981 A1* | 1/2011 | Mosley et al. | 438/102 |
| 2011/0065224 A1 | 3/2011 | Bollman et al. | |
| 2011/0076798 A1 | 3/2011 | Calzia et al. | |
| 2011/0076799 A1 | 3/2011 | Calzia et al. | |
| 2011/0120343 A1 | 5/2011 | Calzia et al. | |
| 2011/0143051 A1 | 6/2011 | Ohashi et al. | |
| 2011/0189080 A1 | 8/2011 | Curtis et al. | |
| 2011/0287610 A1 | 11/2011 | Calzia et al. | |
| 2011/0287614 A1* | 11/2011 | Calzia et al. | 438/483 |
| 2011/0312160 A1 | 12/2011 | Eldada et al. | |
| 2012/0082794 A1 | 4/2012 | Calzia et al. | |
| 2012/0094431 A1* | 4/2012 | Curtis et al. | 438/102 |
| 2012/0213924 A1* | 8/2012 | Mosley et al. | 427/226 |
| 2013/0078384 A1* | 3/2013 | Mosley et al. | 427/380 |
| 2014/0087512 A1 | 3/2014 | Curtis et al. | |

FOREIGN PATENT DOCUMENTS

| | | |
|---|---|---|
| CN | 101079454 | 11/2007 |
| DE | 4225385 | 2/1994 |
| EP | 0381509 | 8/1990 |
| EP | 0621130 | 10/1994 |
| EP | 0661760 | 5/1995 |
| EP | 0763859 | 3/1997 |
| EP | 1870943 | 12/1998 |
| EP | 0989593 | 3/2000 |
| EP | 1255305 | 6/2002 |
| EP | 1385364 | 1/2004 |
| GB | 1119372 | 7/1968 |
| GB | 1194625 | 6/1970 |
| JP | 2009528681 | 8/2009 |
| JP | 2009528682 | 8/2009 |
| JP | 2009540537 | 11/2009 |
| JP | 2010132521 | 6/2010 |
| WO | 97/22152 | 6/1997 |
| WO | 00/33363 | 6/2000 |
| WO | 03/002225 | 1/2003 |
| WO | 03/026022 | 3/2003 |
| WO | 03/026023 | 3/2003 |
| WO | 03/026024 | 3/2003 |
| WO | 03/026025 | 3/2003 |
| WO | 03/026026 | 3/2003 |
| WO | 03/026028 | 3/2003 |
| WO | 2005/017978 | 2/2005 |
| WO | 2005/059952 | 6/2005 |
| WO | 2006/041199 | 4/2006 |
| WO | WO 2006101986 | 9/2006 |
| WO | 2006/133129 | 12/2006 |
| WO | 2007/082080 | 7/2007 |
| WO | 2007/082084 | 7/2007 |
| WO | 2007/082085 | 7/2007 |
| WO | 2008/021604 | 2/2008 |
| WO | 2008/027571 | 3/2008 |
| WO | WO 2008057119 | 5/2008 |
| WO | WO 2008063190 | 5/2008 |
| WO | WO 2009051862 | 4/2009 |
| WO | WO 2009151665 | 12/2009 |
| WO | WO 2010135667 | 11/2010 |
| WO | WO 2010138635 | 12/2010 |
| WO | WO 2010138636 | 12/2010 |
| WO | WO 2011096914 | 8/2011 |
| WO | WO 2010135665 | 11/2011 |
| WO | WO 2011146115 | 11/2011 |

OTHER PUBLICATIONS

G. Daniel Lilly, Metal and Semiconductor Nanoparticle Self-Assembly, dissertation University of Michigan, 2009.
Kapur et al, Lab to Large Scale Transition for Non-Vacuum Thin Film CIGS Solar Cells, NREL/SR-520-35574, Feb. 2004.
Umur Caglar, Studies of Inkjet Printing Technology with Focus on Electronic Materials, Julkaisu 863, Publication 863, Tampere University of Technology, 2009.
Hatice Sengul et al., Toward Sustainable Nanoproducts, An Overview of Nanomanufacturing Methods, Journal of Industrial Ecology, vol. 12, No. 3, Yale University, 2008.
Dusastre et al., Convenient, room-temperature, amine-assisted routes to metal sulfides, selenides and tellureides, J. Chem Soc., Dalton Trans., 1997, pp. 3505-3508.
Znekuda Malik et al., Atmospheric pressure synthesis of In2Se3, Cu2Se, and CuInSe2 without external selenization from solution precursors, J. Mater. Res., vol. 24, No. 4, 2009.
Mirasano et al., The effect of annealing process on CIGS films prepared by chemical bath deposition, University of Nebraska, 2007.
Kapur et al, Lab to Large Scale Transition for Non-Vacuum Thin Film CIGS Solar Cells, NREL/SR-520-37284, Jan. 2005.
English language translation of abstract of Japanese Patent Publication No. 2009528681.
English language translation of abstract of Japanese Patent Publication No. 2009528682.
English language translation of abstract of Japanese Patent Publication No. 2009540537.
English language translation of abstract of Japanese Patent Publication No. 2010132521.
Mitzi et al., Hydrazine-based deposition route for device-quality CIGS films, Thin Solid Films 517 (2009) 2158-2162.
International search report and written opinion from PCT/US2011/001434, Feb. 22, 2012.
International written opinion from PCT/US2006/060756, Jul. 30, 2007.
International preliminary report from PCT/US2006/060756, May 12, 2009.
International search report and written opinion from PCT/US2011/000870, Sep. 1, 2011.
International preliminary report from PCT/US2010/000311, Aug. 7, 2012.
International search report from PCT/US2010/000311, Apr. 14, 2010.
English language translation of abstract of Japanese Patent Publication No. 2003-282600, Oct. 3, 2003.
Kapur et al, Non-vacuum processing of CuIn1yxGaxSe2 solar cells on rigid and flexible substrates using nanoparticle precursor inks, Thin Solid Films, 431-432, 2003, pp. 53-57.
Mitzi et al., "Hydrazine-based deposition route for device-quality CIGS films", Thin Solid Films 517 (2009) 2158-2162.
Stanbery, "The Intra-absorber Junction (IAJ) Model for the Device Physics of Copper Indium Gallium Selenide-based Photovoltaics," 0-7803-8707-4/05, IEEE, presented Jan. 5, 2005, pp. 355-358.
Stanbery, et al., "XPS Studies of Sodium Compound Formation and Surface Segregation in CIGS Thin Films [Solar Cells]" Photovoltaic Specialists Conference, 1997, Conference Record of the Twenty-Sixth IEEE, Sep.-Oct. 1997, pp. 499-502.
Teherán, et al, "Evolution of the Phases and Chemical Composition During the Formation of CIS Thin Films prepared by Interdiffusion Process in Selenides Layers", Journal of Crystal Growth, Jan. 1998, vol. 183, pp. 352-360.
Tuttle et al., "A 15.2% AMO/1433 W/kg Thin-film Cu(In,Ga)Se2 Solar Cell for Space Applications", Photovoltaic Specialist Conference, 2000. Conference Record of the Twenty-Eighth IEEE, Sep. 2000, pp. 1042-1045.

(56) References Cited

OTHER PUBLICATIONS

Wu et al., "Assembly of Conducting Polymer / Metal Oxide Multiplayer in One Step", Synthetic Metals, 1999, vol. 102, pp. 1268-1269.
Xu et al., "Sonochemical Synthesis of Copper Selenides Nanocrystals with Different Phases", Journal of Crystal Growth, 2002, vol. 234, pp. 263-266.
Yan et al., "Chemical Fluctuation-induced Nanodomains in Cu(In, Ga)Se2 Films", Applied Physics Letters, 2005, vol. 87, No. 12, pp. 121904-1-121904-3.
Yang et al., "The Spectroscopy of InSe Nanoparticles", The Journal of Physical Chemistry B, Jul. 2005, vol. 109, No. 26, pp. 12701-12709.
Yin et al., "Colloidal Nanocrystal Synthesis and the Organic-inorganic Interface", Nature, Sep. 2005, vol. 437, pp. 664-670.
International Preliminary Report on Patentability for International (PCT) Application No. PCT/US2006/060757, issued May 12, 2009, pp. 1-4.
Extended European Search Report for for Application No. 06846272.0, dated Feb. 2, 2012, pp. 1-9.
International Search Report and Written Opinion for International (PCT) Application No. PCT/US2006/060756, Jul. 30, 2007, pp. 1-6.
International Preliminary Report on Patentability for International (PCT) Application No. PCT/US2011/000870, issued Nov. 27, 2012, pp. 1-7.
International Preliminary Report on Patentability for International (PCT) Application No. PCT/US2011/001434, issued Feb. 19, 2013, pp. 1-6.
Anderson et al, "Processing of CuInSe2-Based Solar Cells: Characterization of Deposition Processes in Terms of Chemical Reaction Analyses", Final Report, May 6, 1995-Dec. 31, 1998, National Renewable Energy Laboratory, NREL/SR-520-30391, Jun. 2001, pp. 1-400.
Arya et al, "Solar Cells and Submodules on CIS Prepared by EDCF Method", Photovoltaic Specialists Conference, 1993., Conference Record of the Twenty Third IEEE, May 1993, pp. 516-520.
Braunger et al. "Influence of Sodium, on the Growth of Polycrystalline Cu(In,Ga)Se2 Thin Films" Thin Solid Films, Feb. 2000, vol. 361-362, pp. 161-166.
Burda et al., "Chemistry and Properties of Nanocrystals of Different Shapes"; Chemical Reviews, Apr. 2005, vol. 105, No. 4. pp. 1025-1102.
Cahen et al, "Room Temperature Tailoring of Electrical Properties of Ternary and Multinary Chalcogenide Semiconductors", Proceedings of the 9th International Conference of Ternary and Multinary Compounds, Yokohama,1993; The Japanese Journal of Applied Physics, 1993, vol. 32, Suppl. 32-3, pp. 660-661.
Caspar et al., "Five-fold Symmetry in Crystalline Quasicrystal Lattices", Proceedings of the National Academy of Sciences of the United States of America, Dec. 1996, vol. 93, No. 25, pp. 14271-14278.
Chang et al, "Novel Multilayer Process for CuInSe2 Thin Film Formation by Rapid Thermal Processing", Material Res. Society Symposium Proceedings, 1998, vol. 485, pp. 163-168.
Chen et al., "Thin Film CuInGeSe2 Cell Development", IEEE,1993, pp. 422-425.
Chun et al., "Synthesis of CuInGaSe2 Nanoparticles by Solvothermal Route," Thin Solid Films, Jun. 2005, vol. 480-481, No. 1, pp. 46-49.
Contreras et al, "Progress Toward 20% Efficiency in Cu(In, Ga)Se2 Polycrystalline Thin-film Solar Cells," Progress in Photovoltaics Research and Applications, Short Communication: Accelerated Publication, Jul./Aug. 1999, vol. 7, No. 4, pp. 311-316.
Cyganik et al., "Substructure Formation during Pattern Transposition from Substrate into Polymer Blend Film", Europhysics Letters, Jun. 2003, vol. 62, No. 6, pp. 855-861.
Dhere et al., "Low Toxic Processing of Thin and Ultra-thin CIGSS Absorber Solar Cells", Florida Solar Energy Center, University of Central Florida, pp. 1-2.
Eberspacher et al, "Non-Vacuum Techniques for Fabricating Thin-Film CIGS", IEEE, 2000, pp. 517-520.
Ginley, "Inkjet Direct Write Solar Cells", NREL Project, Dec. 7, 2005, pp. 1-2.
Grisaru et al., "Microwave-assisted Polyol Synthesis of CuInTe2 and CuInSe2 Nanoparticles", Inorganic Chemistry, Nov. 2003, vol. 42, No. 22, pp. 7148-7155.
Gullén et al, "Reaction Pathways to CuInSe2 Formation from Electrodeposited Precursors", Journal of the Electrochemical Society, May 2005, vol. 142, No. 6, pp. 1834-1838.
Hassan et al, "Evaluation and Characterization of Polycrystalline CuInSe2 Thin Film Prepared by the Sandwich Structure Technique", Semiconductor Science and Technology, 1994, vol. 9, No. 6, pp. 1255-1260.
Hiraga et al., "Formation of Decagonal Quasicrystal in the Al—Pd—Mn System and its Structure", Japanese Journal of Applied Physics, Sep. 1991, vol. 30, No. 9A, pp. 2028-2034.
Hollingsworth et al., "Catalyzed Growth a Metastable InS Crystal Structure as Collidial Crystals", Journal of the American Chemical Society, 2000, vol. 122, pp. 3562-3563.
Hua et al., "Electroluminescent Properties of Device Based on ZnS:Tb/CdS Core-shell Nanocrystals", Chemical Physics Letters, 2006, vol. 419, pp. 269-272.
Jiang et al., "Elemental Solvothermal Reaction to Produce Ternary Semiconductor CuInE2(E=S, Se) Nanorods", Inorganic Chemistry, 2000, vol. 39, No. 14, 2964-2965.
Kazmerski et al., "Thin-film CuInSe2/CdS Heterojunction Solar Cells", Applied Physics Letters, Aug. 1976, vol. 29, No. 4, pp. 268-270 Aug. 1976.
Kerr et al., "Rapid Thermal Processing of CIS Precursors", IEEE, 2002, pp. 676-679.
Keyes et al., "Influence of Na on the Electo-optical Properties of Cu(In,Ga)Se2," Photovoltaic Specialists Conference, Conference Record of the Twenty-Sixth IEEE Sep./Oct. 1997, Anaheim, CA, pp. 479-482.
Kumar et al., "Shape Control of II-VI Semiconductor Nanomaterials"; Small, Mar. 2006, vol. 2, No. 3, pp. 316-329.
Lammasniemi et al., "Characteristics of Indium Phosphide Solar cells Bonded in Silicon", Photovoltaic Specialists Conference Record of the Twenty Third IEEE, May 1993, pp. 763-767.
Lee et al., "Field-assisted Bonding Below 200°C Using Metal and Glass Thin-film Interlayers," Applied Physics Letters, Mar. 1987, vol. 50, No. 9, pp. 522-524.
Leterrier et al., "Mechanical Properties of Transparent Functional Thin Films for Flexible Displays", Society of Vacuum Coaters, 46th Annual Technical Conference Proceedings, 2003, pp. 1-6.
Li et al. "Effects of Buffer Layer Processing on CIGS Excess Carrier Lifetime: Application of Dual-beam Optical Modulation to Process Analysis," Photovoltaic Specialists Conference,Conference Record of the Twenty Fifth IEEE, May 1996, pp. 821-824.
Li et al., "Synthesis by a Solvothermal Route and Characterization of CuInSe2 Nanowhiskers and Nanoparticles" Advanced Materials, Dec. 1999, vol. 11, No. 17, pp. 1456-1459.
Li et al., "Sonochemical Process for the Preparation of alpha-CuSe Nanocrystals and Flakes", Journal of Materials Chemistry, 2002, vol. 12, pp. 3723-3727.
Manna et al., "First-Principles Modeling of Unpassivated and Surfactant-Passivated Bulk Facets of Wurtzite CdSe: A Model System for Studying the Anisotropic Growth of CdSe Nanocrystals"; Journal of Physical Chemistry B, 2005, vol. 109, No. 13, pp. 6183-6192.
Murray et al., "Synthesis and Characterization of Monodisperse Nanocrystals and Close-packed Nanocrystal Assemblies", Annual Reviews of Materials Science, Aug. 2000, vol. 30, pp. 545-610.
Nakada et al, "Preparation and Characterization of CuInSe2 Films for PV Applications by Low Pressure Vapor Phase Selenization", Proceedings of the 11th E.C. Photovoltaic Solar Energy Conference, pp. 794-797 Oct 12-16, 1992.
Noufi et al. "Chemical Fluctuation-induced Nanodomains in Cu(In,Ga)Se2 films," 20th European Photovoltaic Solar Energy Conference, Jun. 6-10, 2005, Barcelona, Spain, pp. 1744-1747.

(56) References Cited

OTHER PUBLICATIONS

Nowlan et al. "Direct Cover Glass Bonding to GaAs and GaAs/Ge Solar cells" Proceedings of the Photovoltaic Specialists Conference, Las Vegas, Oct. 7-11, 1991, pp. 1480-1484.

Park et al., "Phase-controlled One-Dimensional Shape Evolution of InSe Nanocrystals", Journal of the American Chemical Society, Oct. 28, 2006, vol. 128, No. 46, pp. 14780-14781.

Peng et al., "Epitaxial Growth of Highly Luminescent CdSe/CdS Core/Shell Nanocrystals with Photostability and Electronic Accessibility", Journal of the American Chemical Society, Jul. 30, 1997, vol. 119, No. 30, pp. 7019-7029.

Pinna et al., "Triangular CDS Nanocrystals: Structural and Optical Studies", Advanced Materials, Feb. 2001, vol. 13, No. 4, pp. 261-264.

Probst et al., "Advanced Stacked Elemental Layer Process for Cu(InGa)Se2 Thin Film Photovoltaic Devices," MRS Proceedings, 1996, vol. 426, pp. 165-176.

Probst et al., "Rapid CIS-process for high efficiency PV-modules: development towards large area processing," Thin Solid Films, 2001, vol. 387, Nos. 1-2, pp. 262-267.

Probst et al., "The Impact of Controlled Sodium Incorporation on Rapid Thermal Processed Du(InGa)Se2—Thin Films and Devices," Photovoltaic Energy Conversion, 1994, Conference Record of the Twenty Fourth IEEE Photovoltaic Specialists Conference, 1994 IEEE First World Conference on Photovoltaic Energy Conversion—WPCPEC, Dec. 1994, pp. 144-147.

Puzder et al., "The Effect of Organic Ligand Binding on the Growth of CdSe Nanoparticles Probed by Ab Initio Calculations", NANO Letters, Oct. 2004, vol. 4, No. 12, pp. 2361-2365.

Revaprasadu et al, "Novel Single-molecule Precursor Routes for the Direct Synthesis of InS and InSe Quantum Dots", Journal of Materials Chemistry, 1999, vol. 9, pp. 2885-2888.

Ridley, "Printed Inorganic Transistors", Dissertation, Massachusetts Institute of Technology, Sep. 2003, pp. 1-175.

Schock, "Thin Film Photovoltaics", Applied Surface Science, Feb. 2, 1996, vol. 92, pp. 606-616.

Schulz et al., "CIGS Films Via Nanoparticle Spray Deposition: Attempts at Densifying a Porous Precursor", Presented at the 26th IEEE Photovoltaic Specialists Conference, Sep. 29th-Oct. 3, 1997, Anaheim, CA, NREL CP-520-22959, pp. 1-5.

Stanbery et al., "Reaction Engineering and Precursor Film Deposition for CIS Synthesis", National Renewable Energy Laboratory and Sandia National Laboratories Photovoltaics Program Review Meeting, AIP Conference Proceedings, 1997, vol. 394, pp. 579-588.

Stanbery et al., "Role of Sodium in the Control of Defect Structures in CIS [solar cells]," Photovoltaic Specialists Conference, 2000. Conference Record of the Twenty-Eighth IEEE, Sep. 2000, pp. 440-445.

Stanbery, "Copper Indium Selenides and Related Materials for Photovoltaic Devices," Critical Reviews in Solid State and Material Sciences, Apr.-Jun. 2002, vol. 27, No. 2, pp. 73-117.

\* cited by examiner

LIQUID PRECURSOR INKS FOR DEPOSITION OF IN—SE, GA—SE AND IN—GA—SE

CROSS-REFERENCE TO RELATED APPLICATION

This application claims a benefit of priority under 35 U.S.C. 119(e) from provisional patent application U.S. Ser. No. 61/689,182, filed May 31, 2012, the entire contents of which are hereby expressly incorporated herein by reference for all purposes.

STATEMENT AS TO RIGHTS TO INVENTIONS MADE UNDER FEDERALLY-SPONSORED RESEARCH OR DEVELOPMENT

The United States Government has rights in this invention under Contract No. DE-AC36-08GO28308 between the United States Department of Energy and the Alliance for Sustainable Energy, LLC, the Manager and Operator of the National Renewable Energy Laboratory. This invention was made under a CRADA # CRD-03-121 between HelioVolt Corporation and the National Renewable Energy Laboratory operated for the United State Department of Energy.

BACKGROUND

Compounds of Groups IB, IIIA and VIA, especially copper indium diselenide (CIS) and copper indium gallium diselenide (CIGS), have been studied as semiconductor materials for a number of thin-film semiconductor applications. One key application is their use as light absorbing materials in solar cell components. The elements forming these compounds are relatively common and fairly inexpensive, and when formulated and processed into light absorbing materials (e.g., CIS and CIGS), they are highly efficient in converting solar energy to electrical energy.

Unfortunately, cost effective methods of fabricating these light absorbing materials, especially in the form of thin films, have been elusive and limited at best. Most current fabrication methods of light absorbing materials (e.g., CIS and CIGS) rely on vacuum deposition techniques (e.g., physical vapor deposition), which are generally expensive and labor-intensive.

Recent advances in the thin film technology involve the use of liquid precursors to deposit precursors of light absorbing materials. Liquid precursors for use in thin film deposition represent less expensive alternatives to vacuum deposition technology. Liquid precursors provide distinct advantages over conventional vacuum deposition technology including higher throughput, lower cost and more efficient material utilization. In addition, liquid precursors are compatible with a broader range of substrate types and surface morphologies including very large substrates or those having considerable flexibility.

Liquid precursors are generally formulated to contain a combination of metal and a multinary chalcogenide material each selected, respectively, from the elements of Group IB, Group IIIA and Group VIA, utilizing hydrazine as a solvent. Upon deposition, the liquid precursor converts into a desired solid precursor or a metal chalcogenide through the application of heat. The deposited solid precursor can then be processed via suitable means in combination with other solid precursors to produce the final light absorbing material (e.g., CIS and CIGS). Of particular interest is the use of precursor solutions for deposition of indium selenide, gallium selenide and indium gallium selenide.

In the past, reducing agents have been used to prepare such liquid precursors. The use of hydrazine as a solvent is problematic. Hydrazine is a volatile, corrosive liquid that is expensive, highly toxic and dangerously unstable. Its use therefore is strictly controlled. For the same reasons, hydrazine-containing liquid precursors require special care and handling, and implementation of extensive safety measures. Thus, the cost and difficulty associated with making and using hydrazine-containing liquid precursors is considerably high.

In view of the foregoing, there is a need in the art for liquid precursors and methods of preparing the same that are safer, simpler and more cost efficient, while retaining the desirable properties of liquid precursors.

SUMMARY

There is a need for the following embodiments of the present disclosure. Of course, the invention is not limited to these embodiments.

According to an embodiment of the present disclosure, a process comprises: preparing an ink including mixing i) a solution of selenium in ethylene diamine solvent with ii) a solution of at least one metal salt selected from the group consisting of an indium salt or a gallium salt in at least one solvent including an organic amide. According to another embodiment of the present disclosure, a process comprises: forming a solid precursor on a substrate including applying to a surface of the substrate an ink including i) a solution of selenium in ethylene diamine solvent and ii) a solution of at least one metal salt selected from the group consisting of an indium salt or a gallium salt in at least one solvent including an organic amide; and subjecting the ink to a heating regime for a time sufficient to solidify the ink on the substrate in the form of the solid precursor. According to another embodiment of the present disclosure, a composition of matter comprises: an ink including i) a solution of selenium in ethylene diamine solvent and ii) a solution of at least one metal salt selected from the group consisting of an indium salt or a gallium salt in at least one solvent including an organic amide.

These, and other, embodiments of the present disclosure will be better appreciated and understood when considered in conjunction with the following description and the accompanying drawings. It should be understood, however, that the following description, while indicating various embodiments of the present disclosure and numerous specific details thereof, is given for the purpose of illustration and does not imply limitation. Many substitutions, modifications, additions and/or rearrangements may be made within the scope of embodiments of the present disclosure, and embodiments of the present disclosure include all such substitutions, modifications, additions and/or rearrangements.

BRIEF DESCRIPTION OF THE DRAWINGS

The drawings accompanying and forming part of this specification are included to depict certain embodiments of the present disclosure. A clearer concept of the embodiments described in this application will be readily apparent by referring to the exemplary, and therefore nonlimiting, embodiments illustrated in the drawings (wherein identical reference numerals (if they occur in more than one view) designate the same elements). The described embodiments may be better understood by reference to one or more of these drawings in combination with the following description presented herein.

It should be noted that the features illustrated in the drawings are not necessarily drawn to scale.

DETAILED DESCRIPTION

Figure 1:
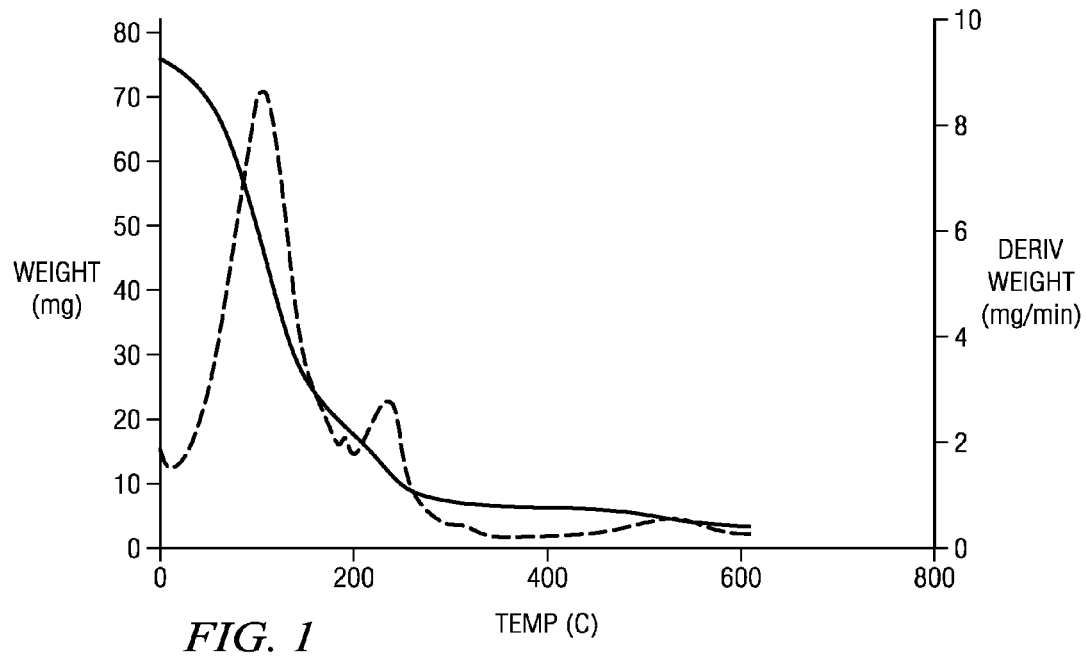
FIG. 1 is a trace view of weight and derivative weight of an indium gallium selenium liquid precursor ink as a function of processing temperature, representing exemplary embodiments.

Embodiments presented in the present disclosure and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the embodiments of the present disclosure in detail. It should be understood, however, that the detailed description and the specific examples are given by way of illustration only and not by way of limitation. Various substitutions, modifications, additions and/or rearrangements within the scope of the underlying inventive concept will become apparent to those skilled in the art from this disclosure.

Embodiments of the present disclosure relate generally to the field of liquid precursor inks. More particularly, an embodiment of the present disclosure relates to metal organic liquid precursor inks for the deposition of In—Se, Ga—Se and/or In—Ga—Se films.

Indium selenide and/or gallium selenide containing films are useful in the fabrication of copper indium diselenide (CIS) and/or copper indium gallium diselenide (CIGS) light absorbing materials for solar cells. For example, in one embodiment, a copper selenide layer can be placed in contact with indium selenide and/or gallium selenide layer(s) under reactive conditions including heat and pressure to yield CIS and/or CIGS light absorbing materials for solar cells. The liquid precursors (or liquid precursor "inks") described herein are suitable for applications such as, but not limited to, forming solid indium selenide and/or gallium selenide containing films on a substrate. The solid precursor is generally formed by heating the deposited ink to a temperature and for a time sufficient to drive off the volatile components.

In one embodiment, the liquid precursor inks can be prepared by mixing a solution of selenium in ethylene diamine solvent with a solution of indium, gallium, or mixed salts in an organic amide solvent, such as for example dimethylformamide (DMF) solvent. Dimethylformamide is an organic amide, which can be an organic hydrocarbon residue bonded to an amide group —C(O)NH2. The NH2 part of this residue can also be substituted. For example, in DMF it is an N(CH3)2 group. A general amide can be represented as R—C(O)NR'R", where R, R' and R" can be H, CH3, and C2H5, or other (combinations of) linear and/or branched hydrocarbons.

In another embodiment, the liquid precursor inks can be prepared by mixing a solution of selenium in ethylene diamine solvent with a solution of indium, gallium, or mixed salts in an organic amide solvent, such as for example N-methylpyrrolidone (NMP) solvent. N-methylpyrolidone is a 5-membered ring lactam (a cyclic organic amide). In alternate embodiments, the N can be substituted with other alkyl groups in place of methyl and there are 6-membered ring analogs. This is a very polar, aprotic solvent.

In other embodiments, the liquid precursor inks can be prepared by mixing a solution of selenium in ethylene diamine solvent with a solution of indium, gallium, or mixed salts in an organic amide solvent, including at least one member selected from the group consisting of formamides, acetamides or benzamides. These include formamide, acetamide, benzamide, substituted formamides (e.g. N-methylformamide, N-ethylformamide, N,N-diethylformamide, etc.), substituted acetamides (e.g. N-methylacetamide, N,N-dimethylacetamide, N-methoxy-N-methylacetamide) and/or substituted benzamides (e.g. N-methylbenzamide, N,N-dimethylbenzamide).

The selenium solution can be produced by heating Se in ethylene diamine.

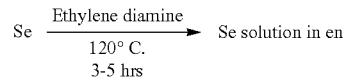

Note that no reducing agent is required to dissolve Se in ethylene diamine. Thus, the use of reducing agent(s) (e.g. hydrazine, hydrazinium, formic acid and/or formate salts) can be omitted. The solution of Se in ethylene diamine is a selenium ink and a precursor for metal selenide liquid precursor inks.

The metal solution can be prepared by dissolving salts of In, Ga, or a mixture of the two, such as in dimethylformamide (DMF) and/or N-methylpyrrolidone (NMP). Preferred salts include nitrate salts and chloride salts, but other salts should work also. For In/Ga mixtures, preferred salts are those with the same anion, ie $In(NO_3)_3+Ga(NO_3)_3$ or $InCl_3+GaCl_3$.

The metal solutions can be prepared by stirring the salt in the solvent briefly at room temperature. All of the operations can be carried out under a nitrogen atmosphere.

The liquid precursor inks (precursor solutions) may prepared by mixing appropriate amounts of the Se solution and the metal or mixed metal solution. The amount of Se relative to metal can be varied and produces completely soluble and stable liquid precursor inks for all compositions examined so far indicating wide process tolerance. In view of the intended products of the liquid precursor inks, preferred Se/M ratios are from approximately 1/2 to approximately 4/1. Specifically with regard to making CIS and CIGS, particularly preferred liquid precursor inks have Se/M ratios of from approximately 1/1 to approximately 2/1.

Se/en=selenium dissolved in ethylene diamine

MX$_3$/DMF=metal salt dissolved in DMF

For the liquid precursor inks with Se/M=1/1 the "reaction" is:

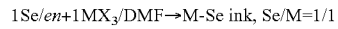

Where M=In, Ga, In+Ga; X=Cl$^-$, NO$_3^-$

For the liquid precursor inks with Se/M=2/1 the "reaction" is:

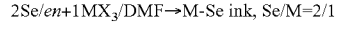

Where M=In, Ga, In+Ga; X=Cl$^-$, NO$_3^-$

The term "reaction" is in quotations because it may be that a chemical reaction occurs, or it may be that this is really a stable mixture of precursors that react upon deposition or processing. An alternative but more nebulous term would be process.

All of the compositions represented above have been spray deposited on glass at a substrate temperature of 250 C and the compositions were confirmed by XRF. When the films with Se/M=2/1 are annealed at 500 C, some Se is lost and crystalline $M_2Se_3$ phases are observed by XRD. When films with Se/M=1/1 are annealed at 500° C. a product with Se/M=1/1 can be obtained.

Referring to FIG. 1, an exemplary embodiment of an indium gallium selenium liquid precursor ink was deposited on a substrate and analyzed using thermogravimetric testing to determine how the liquid precursor decomposes as a function of temperature. As shown, the liquid precursor fully decomposed at about 325° C. and changes from a selenide to an oxide at about 550° C.

Figure 2:
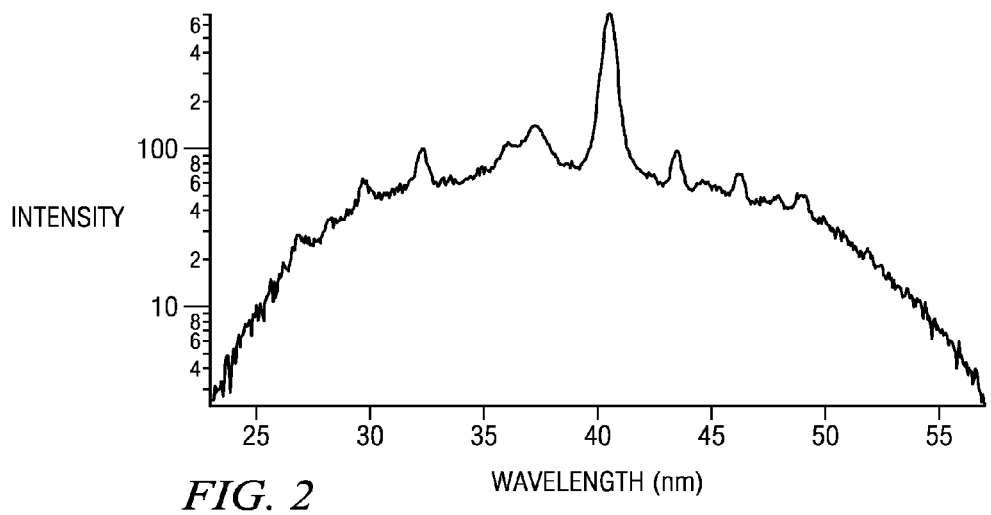
FIG. 2 is a trace view of an X-ray diffraction pattern representing an exemplary embodiment of In—Se film deposited at 250° C. and then annealed at 500° C.

Referring to FIG. 2, an exemplary embodiment of an indium selenium liquid precursor ink was sprayed on a substrate at 250° C., annealed at 500° C. and then analyzed using X-ray diffraction (XRD). The XRD pattern shows that the film contains both crystalline and amorphous material.

The liquid precursor inks allow for deposition by suitable deposition techniques such as drop coating, dip coating, spin coating, spraying, brushing, air brushing, ink jet application, stamping, printing, pouring, wiping, smearing, spray deposition, slot coating, and other methods of applying liquids to the surface of a substrate. For example, the deposition technique may be spray deposition and/or slot coating.

The methods of making the liquid precursor inks can produce a liquid based material or composition that does not contain hydrazine and can be used in deposition techniques that are easier, more efficient and more cost effective to use than solid based deposition techniques such as vacuum deposition. The invention can eliminate the use of hydrazine as a solvent, thus eliminating all procedures known to be used in handling and removing hydrazine. The resulting ink is substantially hydrazine-free, thereby greatly enhancing safety and reducing costs of the process of forming the thin films. The hydrazine-free liquid precursor inks permit deposition of solid precursors in a safer and more cost effective manner than those, which contain hydrazine. In addition, the invention can produce liquid precursor inks with higher precursor (i.e., indium selenide, gallium selenide and indium gallium selenide) concentration levels, thus reducing the time necessary for generating the solid precursor. The liquid precursor inks can be formed as thin films having a desirable indium selenide, gallium selenide or indium gallium selenide composition suitable for use in forming CIS or CIGS thin films useful in the fabrication of solar cells.

An exemplary liquid precursor can include an atomic ratio of cation (e.g., indium, gallium or indium and gallium) to anion (e.g., selenium) of about 11:1 to about 1:2, allowing flexibility in the deposited composition. Typically, most of the selenium is associated with the indium and/or gallium while a minor portion of selenium will be present in elemental form. The liquid precursor can advantageously exhibit a relatively high concentration level of selenium in combination with gallium and/or indium. The indium and/or gallium concentration in the liquid precursor can be in the range of from about 0.08 M to about 0.10 M.

In an exemplary embodiment, there is provided a method of preparing a liquid precursor composition having a desirable indium and/or gallium selenide content. The liquid precursor can be applied to a substrate such as glass and thermally treated in a manner which provides a solid precursor, for example, in the form of a thin film, having a target indium and/or gallium selenide content as described above.

An exemplary method for preparing one exemplary embodiment of the liquid precursor involves dissolving elemental selenium in ethylene diamine; and mixing this first solution with a second solution of an indium salt and/or a gallium salt in an organic amide. The organic amide can be an amide such as dimethylformamide and/or a pyrrolidone such as N-methylpyrrolidone.

If a precipitate forms during the mixing (combining), the precipitate is preferably separated from the liquid precursor. The precipitate, if present, can be separated from the liquid precursor by any suitable separation technique including, but not limited to, filtration, and centrifugation.

The indium salt may be selected from any soluble indium salts such as, for example, indium chloride, indium bromide, indium iodide, indium acetate, indium formate, indium nitrate, indium triflate, and the like. The gallium salt may be selected from any soluble gallium salts such as, for example, gallium chloride, gallium bromide, gallium iodide, gallium acetate, gallium formate, gallium nitrate, gallium triflate, and the like.

Figure 3:
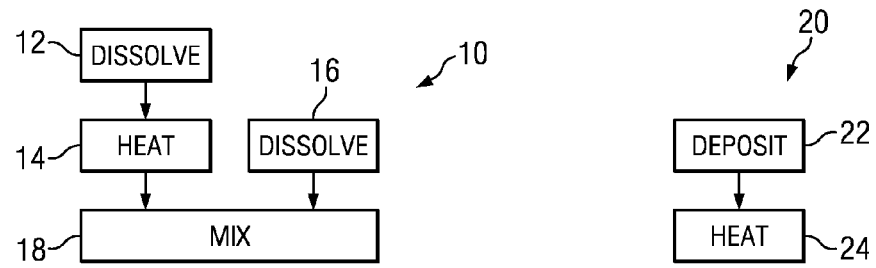
FIG. 3 is a flow chart illustrating steps of a method for preparing a liquid precursor for one embodiment of the present disclosure.

Referring to FIG. 3, a method for preparing a liquid precursor represented generally by reference numeral 10 is shown for one embodiment of the present disclosure. In step 12 of the method 10, selenium powder is dissolved in a first solvent comprising an amine such as, for example, ethylenediamine under a nitrogen atmosphere to yield a selenium solution. In step 14, the selenium solution is heated to a temperature of from about 100° C. to about 140° C., preferably 120° C., for about two to three hours, preferably about three hours, to ensure complete dissolution. In step 16, an indium salt selected, for example, $In(NO_3)_3$ or $InCl_3$ or combinations thereof, and/or a gallium salt selected, for example, from $Ga(NO_3)_3$ or $GaCl_3$ or combinations thereof, are dissolved in a second solvent comprising an amide such as, for example, dimethylformamide and/or a pyrrolidone such as, for example, N-methylpyrrolidone, under a nitrogen atmosphere to yield an indium/gallium solution. In step 18, the In/Ga solution is added to the selenium solution over a period of time, preferably about 15 minutes. The resulting mixture yields a liquid precursor ink.

In an exemplary method of depositing a solid precursor on a substrate, the resulting exemplary liquid precursor is subjected to a heating regime under elevated temperature conditions for a time sufficient to substantially remove the solvent and other volatile components. During this thermal processing, the exemplary liquid precursor can convert to a solid precursor (e.g. In—Se, Ga—Se, In—Ga—Se), as for example, in the form of a thin film. The selection of a temperature and duration of heating have been determined to control the atomic ratio of indium and/or gallium to selenium when the precursor composition is deposited on the substrate (i.e., the relative amount of In and/or Ga and Se in the thin film). Relatively low temperatures favor the formation of a selenium rich species. Relatively higher temperatures favor the formation of the indium and/or gallium rich species. Thus, raising the deposition temperature tends to raise the indium and/or gallium content and lower the selenium content.

With these precursors, the composition of the thin film is determined by the precursor composition and the processing temperature. When precursors with Se/M atomic ratios of 3/1 to 2/1 are deposited at 250 C, the resulting films have a Se/M ratio of 2/1, corresponding to $MSe_2$ (M=In, Ga, In+Ga). Further annealing of these films at 500 C causes Se to be lost and crystalline $M_2Se_3$ films are produced (Se/M=1.5). When precursors with Se/M=1/1 are deposited at 250 C and annealed at 500 C, the 1:1 stoichiometry is maintained throughout the process, but no crystalline products were identified by XRD.

Deposition of the indium and/or gallium selenide liquid precursor ink is preferably made at a deposition temperature of from about 200° C. to about 350°. In this temperature range, the temperature substantially controls the selenium content by way of controlling the thermal decomposition of the various thermodynamically stable phases such as $InSe_2$, InSe and $In_2Se$, their Ga analogues, and alloys thereof. Within this temperature range, the Ga/In ratio does not change substantially from that found in the initial metalorganic compound mixture (i.e. the liquid precursor ink).

Figure 4:
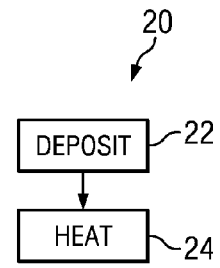
FIG. 4 is a flow chart illustrating steps of a method for depositing a solid precursor on a substrate for one embodiment of the present disclosure.

Referring to FIG. 4, a method for depositing a solid precursor on a substrate represented generally by reference numeral 20 is shown for one embodiment of the present disclosure. In step 22 of the method 20, the liquid precursor as prepared above is applied or deposited on the surface of the substrate via a suitable process such as, for example, spray deposition. In step 24, the deposited liquid precursor is maintained at a deposition temperature of from about 50° C. to about 350° C. for a sufficient time, depending on the desired content of the iridium and/or gallium compounds, to yield a solid precursor. It is noted that the substrate may be heated to the deposition temperature prior to and during the deposition of the liquid precursor to achieve proper deposition conditions. For instance, step 22 can be deposition at 250 C and step 24 can be annealing at 500 C.

The liquid precursor can be deposited on a substrate to yield a solid precursor in the form of a thin film. The liquid precursor can be deposited by suitable deposition techniques such as drop coating, dip coating, spin coating, spraying, brushing, air brushing, ink jet application, stamping, printing, pouring, wiping, smearing, spray deposition, slot coating, and other methods of applying liquids to the surface of a substrate. Preferred deposition techniques include spray deposition or slot coating.

Thereafter, the deposited liquid precursor can subjected to a heating regime at elevated temperature(s). The deposited liquid precursor can subjected to the heating regime at elevated temperature(s) to yield an indium and/or gallium selenide film containing $In_2Se_3$ and/or $Ga_2Se_3$, respectively, as the predominant species. The heating regime can include rapid thermal processing (RTP). The heating regime can include an annealing treatment at relatively lower elevated temperature(s).

Optionally, the liquid precursor may be subjected to the heating regime while the liquid precursor is being deposited on the substrate in a single step process. The liquid precursor can be deposited in a single step heat treating method without resorting to multiple step processes. In particular, the liquid precursor may be heated and converted directly to the desirable indium and/or gallium selenide species as the liquid precursor is deposited on the substrate.

It will be understood that the one step heating process is exemplary and not required. Thus, the liquid precursor described herein may be initially deposited on a substrate at relatively low temperatures and thereafter treated at higher temperatures including rapid thermal processing (RTP) and/or annealing.

The In—Se, Ga—Se and In—Ga—Se containing liquid precursor representing embodiments makes efficient use of selenium and in an exemplary embodiment obviates the need for multiple heating steps. Because In—Se, Ga—Se or In—Ga—Se is produced in a relatively pure form, the liquid precursor inks can be used effectively to facilitate the formation of, for example, CIS or CIGS with large crystal grains in a solid state reaction with Cu—Se.

EXAMPLES

Specific exemplary embodiments will now be further described by the following, nonlimiting examples which will serve to illustrate in some detail various features. The following examples are included to facilitate an understanding of ways in which embodiments of the present disclosure may be practiced. However, it should be appreciated that many changes can be made in the exemplary embodiments which are disclosed while still obtaining like or similar result without departing from the scope of embodiments of the present disclosure. Accordingly, the examples should not be construed as limiting the scope of the invention.

Example 1

A solution of selenium in ethylene diamine was prepared by placing Se powder (0.79 g, 0.010 mole) and ethylene diamine (40 mL) in a flask under a nitrogen atmosphere and heating the mixture to 120 C for 3 hrs, at which point the selenium was completely dissolved to form a brown solution. A second solution was prepared containing indium(III) nitrate hydrate (1.34 g, 0.0035 mol) and gallium(III) nitrate hydrate (0.38 g, 0.0015 mol) dissolved in 20 mL of dimethylformamide under a nitrogen atmosphere. The In/Ga solution was added to the selenium solution over a period of 15 min. The reaction produced an orange solution that was stable for several days without precipitation. This precursor solution was deposited on glass substrates by spray deposition at a substrate temperature of 250 C. The composition of the resulting film was determined by X-ray fluorescence (XRF). The composition found was 23 atomic % In, 10 atomic % Ga and 67 atomic % Se (Se/(In+Ga)=2.0). The film was then annealed at 500 C for 10 minutes; the composition shifted to 28 atomic % In, 12 atomic % Ga, and 60 atomic % Se (Se/(In+Ga)=1.5 and the resulting film was characterized by the XRD scan shown in FIG. 2.

Example 2

A solution of selenium in ethylene diamine was prepared by placing Se powder (0.79 g, 0.010 mole) and ethylene diamine (40 mL) in a flask under a nitrogen atmosphere and heating the mixture to 120 C for 3 hrs, at which point the selenium was completely dissolved to form a brown solution. A second solution was prepared containing indium(III) nitrate hydrate (2.68 g, 0.007 mol) and gallium(III) nitrate hydrate (0.76 g, 0.003 mol) dissolved in 40 mL of dimethylformamide under a nitrogen atmosphere. The In/Ga solution was added to the selenium solution over a period of 15 min. The reaction produced an orange solution that was stable for several days without precipitation. This precursor solution was deposited on glass substrates by spray deposition at a substrate temperature of 250 C. The composition of the resulting film was determined by X-ray fluorescence (XRF). The composition found was 35 atomic % In, 15 atomic % Ga and 50 atomic % Se (Se/(In+Ga)=1.0).

Example 3

A solution of selenium in ethylene diamine was prepared by placing Se powder (0.79 g, 0.010 mole) and ethylene diamine (40 mL) in a flask under a nitrogen atmosphere and heating the mixture to 120 C for 3 hrs, at which point the selenium was completely dissolved to form a brown solution. A second solution was prepared containing indium(III) chloride (0.78 g, 0.0035 mol) and gallium(III) chloride (0.27 g, 0.0015 mol) dissolved in 20 mL of dimethylformamide under a nitrogen atmosphere. The In/Ga solution was added to the selenium solution over a period of 15 min. The reaction produced an orange solution that was stable for several days without precipitation. This precursor solution was deposited on glass substrates by spray deposition at a substrate temperature of 250 C. The composition of the resulting film was determined by X-ray fluorescence (XRF). The composition found was 23 atomic % In, 10 atomic % Ga and 66 atomic % Se (Se/(In+Ga)=2.0).

Example 4

A solution of selenium in ethylene diamine was prepared by placing Se powder (0.79 g, 0.010 mole) and ethylene diamine (40 mL) in a flask under a nitrogen atmosphere and heating the mixture to 120 C for 3 hrs, at which point the selenium was completely dissolved to form a brown solution. A second solution was prepared containing indium(III) chloride (1.56 g, 0.007 mol) and gallium(III) chloride (0.54 g, 0.003 mol) dissolved in 40 mL of dimethylformamide under a nitrogen atmosphere. The In/Ga solution was added to the selenium solution over a period of 15 min. The reaction produced an orange solution that was stable for several days without precipitation. This precursor solution was deposited on glass substrates by spray deposition at a substrate temperature of 250 C. The composition of the resulting film was determined by X-ray fluorescence (XRF). The composition found was 35 atomic % In, 15 atomic % Ga and 50 atomic % Se (Se/(In+Ga)=1.0).

DEFINITIONS

The phrase liquid precursor ink means a precursor solution obtained by mixing a selenium solution and a metal solution. The notation In—Se, Ga—Se, and In—Ga—Se with regard to films means that the liquid precursor inks and corresponding initially deposited films can have varying Se/Metal ratios. Typically after processing (e.g. heating), crystalline, stoichiometric phases are produced. The term soluble means forming a solution when dissolved that contains no visible solids or precipitates, and stable as exhibiting no change in color or appearance and depositing no precipitates within 5 days. Rapid thermal processing (RTP) means a heating regimen in which the target film is heated to a desired temperature in a short time, e.g., no more than about 10 minutes. The desired temperature can be maintained until the heating process is completed.

The term substantially is intended to mean largely but not necessarily wholly that which is specified. The term approximately is intended to mean at least close to a given value (e.g., within 10% of). The term generally is intended to mean at least approaching a given state.

The terms first or one, and the phrases at least a first or at least one, are intended to mean the singular or the plural unless it is clear from the intrinsic text of this document that it is meant otherwise. The terms second or another, and the phrases at least a second or at least another, are intended to mean the singular or the plural unless it is clear from the intrinsic text of this document that it is meant otherwise. Unless expressly stated to the contrary in the intrinsic text of this document, the term or is intended to mean an inclusive or and not an exclusive or. Specifically, a condition A or B is satisfied by any one of the following: A is true (or present) and B is false (or not present), A is false (or not present) and B is true (or present), and both A and B are true (or present). The terms a and/or an are employed for grammatical style and merely for convenience.

The term plurality is intended to mean two or more than two. The term any is intended to mean all applicable members of a set or at least a subset of all applicable members of the set. The term means, when followed by the term "for" is intended to mean hardware, firmware and/or software for achieving a result. The term step, when followed by the term "for" is intended to mean a (sub)method, (sub)process and/or (sub)routine for achieving the recited result. Unless otherwise defined, all technical and scientific terms used herein have the same meaning as commonly understood by one of ordinary skill in the art to which this present disclosure belongs. In case of conflict, the present specification, including definitions, will control.

The described embodiments and examples are illustrative only and not intended to be limiting. Although embodiments of the present disclosure can be implemented separately, embodiments of the present disclosure may be integrated into the system(s) with which they are associated. All the embodiments of the present disclosure disclosed herein can be made and used without undue experimentation in light of the disclosure. Embodiments of the present disclosure are not limited by theoretical statements (if any) recited herein. The individual steps of embodiments of the present disclosure need not be performed in the disclosed manner, or combined in the disclosed sequences, but may be performed in any and all manner and/or combined in any and all sequences. Homologous replacements may be substituted for the substances described herein.

Various substitutions, modifications, additions and/or rearrangements of the features of embodiments of the present disclosure may be made without deviating from the scope of the underlying inventive concept. All the disclosed elements and features of each disclosed embodiment can be combined with, or substituted for, the disclosed elements and features of every other disclosed embodiment except where such elements or features are mutually exclusive. The scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

What is claimed is:

1. A method for preparing a gallium selenide ink, the method comprising:
   mixing a first hydrazine-free and lithium-free solution comprising elemental selenium and ethylene diamine with a second solution comprising a gallium salt and a solvent comprising at least one of an organic amide or N-methylpyrrolidone.

2. The method of claim 1, wherein the solvent consists of at least one of a formamide, an acetamide, a benzamide, or N-methylpyrrolidone.

3. The method of claim 2, wherein the solvent consists of at least one of dimethylformamide or N-methylpyrrolidone.

4. The method of claim 1, wherein the gallium salt includes a nitrate salt.

5. The method of claim 1, wherein the gallium salt includes a chloride salt.

6. A method of forming a solid precursor on a substrate, the method comprising:
applying to a surface of the substrate an ink comprising a first hydrazine-free and lithium-free solution of elemental selenium in ethylene diamine mixed with a second solution comprising a gallium salt and a solvent comprising at least one of an organic amide or N-methylpyrrolidone; and
subjecting the ink and the substrate to a heating regime for a time sufficient to solidify the ink on the substrate in the form of the solid precursor.

7. The method of claim 6, wherein the solvent consists of at least one of a formamide, an acetamide, a benzamide, or N-methylpyrrolidone.

8. The method of claim 7, wherein the solvent consists of at least one of dimethylformamide or N-methylpyrrolidone.

9. The method of claim 6, wherein the gallium salt includes a nitrate salt.

10. The method of claim 6, wherein the gallium salt includes a chloride salt.

11. An ink comprising a solution of elemental selenium in ethylene diamine, a gallium salt, and a solvent comprising at least one of an organic amide or N-methylpyrrolidone.

12. The ink of claim 11, wherein the solvent consists of at least one of a formamide, an acetamide, a benzamide, or N-methylpyrrolidone.

13. The ink of claim 12, wherein the solvent consists of at least one of dimethylformamide or N-methylpyrrolidone.

14. The ink of claim 11, wherein the gallium salt includes a nitrate salt.

15. The ink of claim 11, wherein the gallium salt includes a chloride salt.

\* \* \* \* \*